(12) United States Patent
Nakano et al.

(10) Patent No.: US 7,968,205 B2
(45) Date of Patent: Jun. 28, 2011

(54) CORROSION RESISTANT MULTILAYER MEMBER

(75) Inventors: Hajime Nakano, Tokyo (JP); Toshihiko Tsukatani, Tokyo (JP); Takao Maeda, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1008 days.

(21) Appl. No.: 11/550,929

(22) Filed: Oct. 19, 2006

(65) Prior Publication Data

US 2007/0111030 A1    May 17, 2007

(30) Foreign Application Priority Data

Oct. 21, 2005    (JP) .................................. 2005-307199

(51) Int. Cl.
*B32B 9/00*    (2006.01)

(52) U.S. Cl. ........ 428/469; 428/472; 428/696; 428/701; 428/702

(58) Field of Classification Search ........................ None
See application file for complete search history.

(56) References Cited

U.S. PATENT DOCUMENTS

| 2003/0181065 | A1 | 9/2003 | O'Donnell | |
|---|---|---|---|---|
| 2004/0053081 | A1* | 3/2004 | Sakurai et al. | 428/704 |
| 2005/0037193 | A1 | 2/2005 | Sun et al. | |

FOREIGN PATENT DOCUMENTS

| EP | 1 013 623 A2 | 6/2000 |
|---|---|---|
| JP | 10-45461 A | 2/1998 |
| JP | 11-080925 A | 3/1999 |
| JP | 2002-241971 A | 8/2002 |
| JP | 2002-293630 A | 10/2002 |
| JP | 2002-363725 A | 12/2002 |
| JP | 2004-059397 A | 2/2004 |

OTHER PUBLICATIONS

European Search Report dated Mar. 21, 2007 issued in corresponding European Application No. EP 06 25 5418.

Japanese Office Action dated Sep. 22, 2010, issued in corresponding Japanese Patent Application No. 2006-281247.

* cited by examiner

*Primary Examiner* — Timothy M Speer
(74) *Attorney, Agent, or Firm* — Westerman, Hattori, Daniels & Adrian, LLP

(57) ABSTRACT

A corrosion resistant member to be exposed to a halogen-containing gas atmosphere or a halogen-containing gas plasma atmosphere, comprising a substrate and a plurality of layers deposited thereon including a layer of rare earth fluoride providing the outermost surface and a layer of rare earth oxide having a porosity of less than 5% underlying the rare earth fluoride layer.

10 Claims, No Drawings

CORROSION RESISTANT MULTILAYER MEMBER

CROSS-REFERENCE TO RELATED APPLICATION

This non-provisional application claims priority under 35 U.S.C. §119(a) on Patent Application No. 2005-307199 filed in Japan on Oct. 21, 2005, the entire contents of which are hereby incorporated by reference.

TECHNICAL FIELD

This invention relates to a corrosion resistant member having a multilayer coating including a coating layer of rare earth fluoride providing the outermost surface and a coating layer of rare earth oxide having a porosity of less than 5% disposed underneath, wherein the surface state is kept unchanged even after use in a halogen-containing corrosive gas atmosphere, and more particularly, to a corrosion resistant member having a surface layer of rare earth fluoride to be exposed to a halogen-containing corrosive gas or plasma thereof, which has corrosion resistance to the corrosive gas or plasma thereof and is suitable for use in semiconductor manufacturing apparatus and flat panel display manufacturing apparatus.

BACKGROUND ART

A halogen-containing corrosive gas atmosphere prevails in most semiconductor manufacturing apparatus, and flat panel display manufacturing apparatus such as liquid crystal, organic EL and inorganic EL manufacturing apparatus. Apparatus components are made of high purity materials in order to prevent workpieces from impurity contamination.

The semiconductor manufacturing process employs gate etching systems, insulating film etching systems, resist film ashing systems, sputtering systems, CVD systems and the like. On the other hand, the liquid crystal manufacturing process employs etching systems for forming thin-film transistors and the like. In these processing systems, a plasma-producing mechanism is incorporated for microprocessing to a high degree of integration.

In these processing steps, corrosive gases containing halogen (e.g., fluorine or chlorine) are used as the processing gas due to their reactivity. Typical fluorine-containing gases include $SF_6$, $CF_4$, $CHF_3$, $ClF_3$, HF, $NF_3$, etc. Typical chlorine-containing gases include $Cl_2$, $BCl_3$, HCl, $CCl_4$, $SiCl_4$, etc. When microwave or high frequency is applied to an atmosphere into which such gases have been fed, the gases are activated to a plasma. System members which are exposed to such halogen-containing gases or plasma thereof are required to be highly corrosion resistant.

In view of the above requirement, the materials used in the art to impart corrosion resistance to halogen-containing gas or plasma thereof include ceramics such as quartz, alumina, silicon nitride, and aluminum nitride, anodized aluminum (alumite) coatings, and substrates having coatings of the foregoing ceramics thermally sprayed on their surface. JP-A 2002-241971 discloses a plasma-resistant member comprising a surface region to be exposed to a plasma in a corrosive gas atmosphere, the surface region being formed of a Group IIIA metal layer. The layer has a thickness of about 50 to 200 µm.

However, the ceramic members suffer from the problems that the working cost is high and particles are left on the surface. When the ceramic members are exposed to a plasma in a corrosive gas atmosphere, corrosion proceeds gradually, though to a varying extent depending on the identity of ceramic material. As a result, crystal grains lying in the surface region spall off, causing the so-called "particle contamination." Once spalling off, the particles deposit in proximity to the semiconductor wafer, lower electrode or the like, adversely affecting the etching precision and the like and detracting from the performance and reliability of the semiconductor.

Since the reaction products deposited on the member surface cause particle contamination, the reaction products must be removed by washing. The washing step often uses water. However, the reaction products can react with water to produce acids, which have detrimental impact on the plasma-resistant coating layer and substrate, substantially altering the life of the member.

As the current semiconductor technology is stepping forward targeting a finer feature size and a larger wafer diameter, the so-called dry process, especially etching process, has started using a low-pressure high-density plasma. As compared with conventional etching conditions, the low-pressure high-density plasma has significant impact on plasma-resistant members, giving rise to outstanding problems including erosion by the plasma, contamination of the members caused by the erosion, and contamination with reaction products of surface impurities.

DISCLOSURE OF THE INVENTION

An object of the invention is to provide a corrosion resistant member comprising a substrate and a plasma-resistant coating, which is used in semiconductor manufacturing apparatus and flat panel display manufacturing apparatus employing a plasma etching process, which has sufficient corrosion resistance (or plasma resistance) to a halogen-containing corrosive gas or plasma thereof, and which undergoes minimized damages to the plasma-resistant coating and substrate even after repeated washing of the member for removing the reaction products deposited on the member surface during the plasma etching process.

The inventors have found that a member comprising a substrate, a layer of rare earth fluoride providing the outermost surface to be exposed to a halogen-containing corrosive gas, and a layer of rare earth oxide having a porosity of less than 5% under the fluoride layer, when exposed to a halogen-containing gas or plasma thereof, is effective for restraining damages by plasma erosion and minimizing particle deposition on semiconductor wafers, suggesting that the member is useful in semiconductor and flat panel display manufacturing apparatus. When the member is washed with water for removing the reaction products deposited on the member surface during the plasma etching process, the member is also effective for restraining damages to the plasma-resistant coating and substrate by the acid produced during the aqueous washing of the member. That is, the member is free of a loss of corrosion resistant capability by damages during repeated washing.

The invention provides a corrosion resistant member to be exposed to a halogen-containing gas atmosphere or a halogen-containing gas plasma atmosphere, comprising a substrate and a plurality of layers deposited thereon including a layer of rare earth fluoride providing the outermost surface and a layer of rare earth oxide having a porosity of less than 5% underlying the rare earth fluoride layer.

In a preferred embodiment, for each layer, the rare earth is a single element selected from the group consisting of Y, Sc, La, Ce, Pr, Nd, Sm, Eu, Gd, Tb, Dy, Ho, Er, Tm, Yb, and Lu; or the rare earth is a mixture of at least two elements selected from the same group.

In a more preferred embodiment, the corrosion resistant member consists essentially of the substrate, the rare earth oxide layer thereon, and the rare earth fluoride layer on the oxide layer.

Typically the corrosion resistant member is used in a semiconductor or flat panel display manufacturing apparatus.

BENEFITS OF THE INVENTION

The corrosion resistant member of the invention has improved corrosion resistance to a halogen-containing corrosive gas or plasma thereof, and restrains particle contamination during plasma etching when it is used in semiconductor manufacturing apparatus and flat panel display manufacturing apparatus. The member restrains damages by washing and thus has a longer life. The member allows products of quality to be manufactured efficiently over a prolonged period of time.

DESCRIPTION OF THE PREFERRED EMBODIMENTS

The corrosion resistant member of the invention is a multilayer coated member comprising a substrate, a layer of rare earth fluoride providing the outermost surface to be exposed to a halogen-containing corrosive gas, and a layer of rare earth oxide having a porosity of less than 5% by image analysis between the fluoride layer and the substrate.

With respect to the rare earth used herein, the same or different rare earth elements may be selected for the oxide layer and the fluoride layer. For each layer, the rare earth element is preferably selected from among Y, Sc, La, Ce, Pr, Nd, Sm, Eu, Gd, Tb, Dy, Ho, Er, Tm, Yb, and Lu, and more preferably from among Y, Sc, Gd, Tb, Dy, Ho, Er, Tm, Yb, and Lu. The rare earth elements may be used alone or in a combination of two or more.

The substrate may be selected from among metals, metal alloys, and ceramics, and more specifically from among Al, Mo, Ta, W, Hf, V, Zr, Nb, Ti, stainless steel (SUS), quartz, silicon nitride, alumina, and zirconia.

The corrosion resistant member of the invention is characterized in that a rare earth oxide layer having a porosity of less than 5% and a rare earth fluoride layer are formed on the substrate in the described order.

In another embodiment, a metal layer or ceramic layer may be formed on the substrate and/or on the rare earth oxide layer as an interleaving layer. A further embodiment is a multilayer structure including more than one set of rare earth oxide layer/rare earth fluoride layer, which is arrived at, for example, by forming a first rare earth oxide layer on the substrate, forming a first rare earth fluoride layer on the first oxide layer, forming a second rare earth oxide layer on the first fluoride layer, subsequently forming a second rare earth fluoride layer, and so on. In these embodiments, the outermost layer should be rare earth fluoride.

The metal used in the interleaving layer is selected from among Ni, Al, Mo, Hf, V, Nb, Ta, W, Ti, and Co, for example. The ceramic used in the interleaving layer is selected from among alumina, zirconia, silicon nitride, boron carbide, and silicon carbide, for example.

The process of forming a plurality of layers may be any of thermal spraying, sputtering, evaporation, and ion plating processes, but is not limited thereto.

Also the process of forming the intermediate layer of rare earth oxide may be any of thermal spraying, sputtering, evaporation, and ion plating processes, but is not limited thereto, so long as a rare earth oxide layer having a porosity of less than 5%, especially up to 4.9% can be prepared. It is preferred to form the oxide layer by thermal spraying because the fluoride layer is subsequently formed on the oxide layer. In this case, the layer of rare earth oxide having a porosity of less than 5% can be obtained by selecting the spray distance (the distance between a spray nozzle and a substrate to be sprayed) or shortening the spray distance, although the method of preparing the layer of rare earth oxide having a porosity of less than 5% is not limited thereto.

The rare earth fluoride layer may be a thermally sprayed coating, a sintered layer, a physically deposited coating, a chemically deposited coating or the like, with the sprayed coating being preferred. Fluorides of some particular rare earth elements have a phase transition point. Specifically, since fluorides of Y, Sm, Eu, Gd, Er, Tm, Yb and Lu undergo a phase change upon cooling from the sintering temperature, it is difficult to produce a sintered layer thereof. For forming fluoride layers of these elements, the thermal spraying process is especially preferred.

Either atmospheric or low pressure spraying may be used. That is, the spraying atmosphere may be atmospheric or sub-atmospheric. The spraying equipment is operated by feeding the reactant powder thereto and controlling the distance between the nozzle and the substrate and the spraying rate, until the material is deposited to the desired thickness.

The thermal spraying process enables formation of a dense coating because a coating sprayed on a substrate is quenched so that high-temperature phases are locally left.

As a general rule, corrosion resistant films can be deposited on substrates by a number of processes including physical deposition processes such as sputtering, evaporation, and ion plating; chemical deposition processes such as plasma CVD and pyrolytic CVD; and wet coating processes such as sol-gel process and slurry coating. In an attempt to manufacture the corrosion resistant member of the invention by such deposition processes, problems arise because the coating should preferably be relatively thick, specifically as thick as 1 µm or greater, and highly crystalline. The physical and chemical deposition processes are uneconomical because an extremely long time is necessary until the desired thickness is reached. Additionally, these processes need a vacuum atmosphere, which also becomes an uneconomical factor. As semiconductor wafers and glass substrates currently become large-sized, members in the manufacturing apparatus are also increased in size. Thus large-size vacuum pump units are necessary to deposit coatings on such large-size members.

On the other hand, the chemical deposition processes such as CVD, sol-gel process and the like also encounter the problem of enlarged manufacturing apparatus and require high-temperature heating to produce highly crystalline coatings. Then a choice of substrates that can be coated by these processes is limited. It is difficult to deposit coatings on resin and other materials which are less heat resistant than ceramic and metal materials.

JP-A 2002-293630 discloses a method of fluorinating a IIIA group element-containing ceramic material for modifying the surface to a IIIA group element fluoride. This method imposes a limit on the choice of substrate material because the substrate must contain the IIIA group element. The method is difficult to form a surface layer as thick as 1 µm or greater.

For the above-discussed reason, the invention favors a process which can deposit a coating with a thickness of 1 to 1,000 µm at a relatively high rate, can form a highly crystalline coating, and imposes little limits on the material and size of substrates. Desired from this point of view are a thermal spray process involving melting or softening a material and depositing molten droplets on a substrate until a coating is built up, and a cold spraying or aerosol deposition process involving impinging solid microparticulates against a substrate at a high speed for deposition.

With respect to the coating thickness, no problems arise as long as the rare earth fluoride layer has a thickness of at least 1 μm. The fluoride layer generally has a thickness of 1 to 1,000 μm. A thickness of 10 to 500 μm is preferred, and a thickness of 30 to 300 μm is most preferred, for the coated member to have a longer lifetime since corrosion is not always nil. Also preferably, the rare earth oxide layer has a thickness of 1 to 500 μm, and a thickness of 20 to 300 μm, especially 50 to 300 μm is more preferred for the additional purpose of reducing the amount of substrate material dissolved out with acid.

When a metal or ceramic layer is formed on the substrate, its thickness is preferably in the range of 10 to 500 μm, more preferably 30 to 300 μm. When a metal or ceramic layer is formed between the rare earth oxide layer and the rare earth fluoride layer, the thickness of the interleaving layer is preferably in the range of 10 to 500 μm, more preferably 30 to 300 μm.

The multilayer structure preferably has a total thickness in the range of 2 to 2,000 μm, more preferably 30 to 1,000 μm.

The semiconductor manufacturing process involves dry etching steps where etching of polysilicon gate electrodes uses a plasma of a gas mixture containing one or more of $CCl_4$, $CF_4$, $CHF_3$, and $NF_3$; etching of aluminum interconnects uses a plasma of a gas mixture containing one or more of $CCl_4$, $BCl_3$, $SiCl_4$, $BBr_3$, and HBr; etching of tungsten interconnects uses a plasma of a gas mixture containing one or more of $CF_4$, $CCl_4$, and $O_2$. In the CVD process, silicon film formation uses a gas mixture of $SiH_2Cl_2/H_2$ or the like, $Si_3N_4$ formation uses a gas mixture of $SiH_2Cl_2/NH_3/H_2$ or the like, and TiN film formation uses a gas mixture of $TiCl_4/NH_3$ or the like. In the prior art, ceramics such as quartz, alumina, silicon nitride and aluminum nitride and anodized aluminum (alumite) coatings used to provide the surface to be exposed to the above-described gas or plasma have insufficient corrosion resistance, allowing the corrosion resistant material to be etched. This results in spalling off of ceramic grains, exposure of aluminum surface due to degradation of alumite coating, or formation of aluminum chloride particles. If spalling grains and aluminum chloride particles are introduced to wafers, they cause product defectives.

After use in the plasma or otherwise processing step, the member is washed with deionized water for removing deposits on the surface. During water washing, the reaction products deposited on the member surface may produce acids, which can attack the member substrate of aluminum alloy or stainless steel, reducing the life of the member.

In contrast, a multilayer coating including a rare earth fluoride layer as the outermost and a rare earth oxide layer underneath and providing a surface to be exposed to a halogen-containing gas or plasma thereof is effective for minimizing the formation of reaction products with the halogen-containing corrosive gas. The rare earth oxide layer having a porosity of less than 5% formed as the intermediate layer functions such that the acid generated during the washing of the member with deionized water is consumed through reaction with rare earth oxide, restraining damages to the substrate. As a result, the member has a prolonged life. The rare earth oxide layer having a porosity of 5% or more can give the reaction between the acid and the rare earth oxide. However, since the acid would reach the substrate to some extent because of numerous pores before the acid is completely consumed by the reaction, the substrate would be damaged by the reached acid.

The lower limit of the porosity is not limited and may be 0%. Usually, the porosity may be at least 0.5%.

EXAMPLE

Examples of the invention are given below by way of illustration and not by way of limitation.

Example 1

An aluminum alloy substrate of 20 mm by 20 mm at its surface was degreased with acetone. One surface was roughened with corundum abrasives. By using an atmospheric plasma spraying equipment and feeding argon gas as a plasma gas, yttrium oxide powder was sprayed onto the roughened surface of the substrate at a power of 40 kW, a spray distance of 100 mm, and a rate of 30 μm/pass to form an oxide coating of 150 μm thick. The resulting oxide layer had a porosity of 4.8% by image analysis. Subsequently, yttrium fluoride powder was sprayed onto the oxide layer under the same conditions as above, to form a fluoride coating of 50 μm thick. A sample having a multilayer coating with a total thickness of 200 μm was obtained.

Example 2

An aluminum alloy substrate of 20 mm by 20 mm at its surface was degreased with acetone. One surface was roughened with corundum abrasives. By using an atmospheric plasma spraying equipment and feeding argon gas as a plasma gas, yttrium oxide powder was sprayed onto the substrate at a power of 40 kW, a spray distance of 100 mm, and a rate of 30 μm/pass to form an oxide coating of 100 μm thick. The resulting oxide layer had a porosity of 4.8% by image analysis. Subsequently, yttrium fluoride powder was sprayed onto the oxide layer under the same conditions as above, to form a fluoride coating of 100 μm thick. A sample having a multilayer coating with a total thickness of 200 μm was obtained.

Example 3

An aluminum alloy substrate of 20 mm by 20 mm at its surface was degreased with acetone. One surface was roughened with corundum abrasives. By using an atmospheric plasma spraying equipment and feeding argon gas as a plasma gas, yttrium oxide powder was sprayed onto the substrate at a power of 40 kW, a spray distance of 100 mm, and a rate of 30 μm/pass to form an oxide coating of 100 μm thick. The resulting oxide layer had a porosity of 4.8% by image analysis. Subsequently, yttrium fluoride powder was sprayed onto the oxide layer under the same conditions as above, to form a fluoride coating of 20 μm thick. Yttrium oxide powder was sprayed again under the same conditions to form a coating of 50 μm thick. Yttrium fluoride powder was further sprayed under the same conditions to form a coating of 30 μm thick. A sample having a multilayer coating with a total thickness of 200 μm was obtained.

Example 4

An aluminum alloy substrate of 20 mm by 20 mm at its surface was degreased with acetone. One surface was roughened with corundum abrasives. By using an atmospheric plasma spraying equipment and feeding argon gas as a plasma gas, gadolinium oxide powder was sprayed onto the substrate at a power of 40 kW, a spray distance of 100 mm, and a rate of 30 μm/pass to form an oxide coating of 150 μm thick. The resulting oxide layer had a porosity of 4.2% by image analysis. Subsequently, gadolinium fluoride powder was sprayed onto the oxide layer under the same conditions as above, to form a fluoride coating of 50 μm thick. A sample having a multilayer coating with a total thickness of 200 μm was obtained.

Example 5

An aluminum alloy substrate of 20 mm by 20 mm at its surface was degreased with acetone. One surface was roughened with corundum abrasives. By using an atmospheric plasma spraying equipment and feeding argon gas as a plasma gas, dysprosium oxide powder was sprayed onto the substrate at a power of 40 kW, a spray distance of 100 mm, and a rate of 30 μm/pass to form an oxide coating of 150 μm thick. The resulting oxide layer had a porosity of 4.3% by image analysis. Subsequently, dysprosium fluoride powder was sprayed onto the oxide layer under the same conditions as above, to form a fluoride coating of 50 μm thick. A sample having a multilayer coating with a total thickness of 200 μm was obtained.

Comparative Example 1

An aluminum alloy substrate of 20 mm by 20 mm at its surface was degreased with acetone. It was a sample without a corrosion resistant coating.

Comparative Example 2

An aluminum alloy substrate of 20 mm by 20 mm at its surface was degreased with acetone. One surface was roughened with corundum abrasives. By using an atmospheric plasma spraying equipment and feeding argon gas as a plasma gas, yttrium oxide powder was sprayed onto the substrate at a power of 40 kW, a spray distance of 100 mm, and a rate of 30 μm/pass to form an oxide coating of 200 μm thick. The resulting oxide layer had a porosity of 4.8% by image analysis. A sample having a single layer coating was obtained.

Comparative Example 3

An aluminum alloy substrate of 20 mm by 20 mm at its surface was degreased with acetone. One surface was roughened with corundum abrasives. By using an atmospheric plasma spraying equipment and feeding argon gas as a plasma gas, yttrium oxide powder was sprayed onto the roughened surface of the substrate at a power of 40 kW, a spray distance of 150 mm, and a rate of 30 μm/pass to form an oxide coating of 150 μm thick. The resulting oxide layer had a porosity of 8.7% by image analysis. Subsequently, yttrium fluoride powder was sprayed onto the oxide layer under the conditions at a power of 40 kW, a spray distance of 100 mm, and a rate of 30 μm/pass by using an atmospheric plasma spraying equipment and feeding argon gas as a plasma gas, to form a fluoride coating of 50 μm thick. A sample having a multilayer coating with a total thickness of 200 μm was obtained.

Comparative Example 4

An aluminum alloy substrate of 20 mm by 20 mm at its surface was degreased with acetone. One surface was roughened with corundum abrasives. By using an atmospheric plasma spraying equipment and feeding argon gas as a plasma gas, yttrium oxide powder was sprayed onto the roughened surface of the substrate at a power of 40 kW, a spray distance of 130 mm, and a rate of 30 μm/pass to form an oxide coating of 150 μm thick. The resulting oxide layer had a porosity of 5.5% by image analysis. Subsequently, yttrium fluoride powder was sprayed onto the oxide layer under the conditions at a power of 40 kW, a spray distance of 100 mm, and a rate of 30 μm/pass by using an atmospheric plasma spraying equipment and feeding argon gas as a plasma gas, to form a fluoride coating of 50 μm thick. A sample having a multilayer coating with a total thickness of 200 μm was obtained.

Plasma Corrosion Resistance Test

The sample was masked with polyimide tape to leave open a central area of 10 mm by 10 mm and exposed for 10 hours to a $CF_4$ plasma created by a reactive ion etching (RIE) system. The plasma producing conditions included a power of 0.55 W, a gas mixture of $CF_4$ and 20% $O_2$, a gas flow rate of 50 sccm, and a pressure of 7.9-6.0 Pa. After the test, the sample surface was measured for height under a laser microscope to determine a height difference between the exposed and masked areas, which indicates an erosion depth.

The results are shown in Table 1.

TABLE 1

| | Sprayed layer material* | Porosity of rare earth oxide layer (%) | Erosion depth (μm) |
|---|---|---|---|
| Example 1 | $Y_2O_3$ 150 μm + $YF_3$ 50 μm | 4.8 | 1.5 |
| Example 2 | $Y_2O_3$ 100 μm + $YF_3$ 100 μm | 4.8 | 1.4 |
| Example 3 | $Y_2O_3$ 100 μm + $YF_3$ 20 μm + $Y_2O_3$ 50 μm + $YF_3$ 30 μm | 4.8 | 1.5 |
| Example 4 | $Gd_2O_3$ 150 μm + $GdF_3$ 50 μm | 4.2 | 1.6 |
| Example 5 | $Dy_2O_3$ 150 μm + $DyF_3$ 50 μm | 4.3 | 1.6 |
| Comparative Example 1 | none (aluminum alloy) | — | 4.1 |
| Comparative Example 2 | $Y_2O_3$ 200 μm | 4.8 | 1.6 |
| Comparative Example 3 | $Y_2O_3$ 150 μm + $YF_3$ 50 μm | 8.7 | 1.5 |
| Comparative Example 4 | $Y_2O_3$ 150 μm + $YF_3$ 50 μm | 5.5 | 1.5 |

*Layers disposed from the substrate side to the outermost side are described from left to right.

It is seen from the erosion depth data in Table 1 that as compared with the uncoated sample of Comparative Example 1, the coated samples of Examples 1 to 5 and Comparative Examples 2 to 4 show satisfactory plasma corrosion resistance. It is demonstrated that they maintain satisfactory performance in a semiconductor or flat panel display manufacturing apparatus where the members are exposed to a halogen-containing gas atmosphere or halogen-containing gas plasma atmosphere.

Member Surface Acid Resistance Test

As mentioned previously, the coating layer and substrate can be damaged by the acid generated during washing of the member with deionized water. The acid resistance of the member was examined by the following test. A sample was inserted and secured to a polyvinyl chloride pipe (inner diameter 16 mm, wall thickness 3 mm, height 30 mm). To the standing pipe was fed 3 cc of 0.5 mol/l hydrochloric acid solution, in which the sample was immersed. The pipe was held for 5 hours at 25° C. The amounts of coating material element and substrate material element dissolved in the solution were quantitatively determined by ICP analysis. A similar test was made using 0.5 mol/l hydrofluoric acid solution, and the amounts of elements dissolved were determined. The results of the acid resistance tests are shown in Table 2.

TABLE 2

|  | 0.5 mol/l HCl | | 0.5 mol/l HF | |
| --- | --- | --- | --- | --- |
|  | $R_2O_3$ (g/l) | Al (mg/l) | $R_2O_3$ (g/l) | Al (mg/l) |
| Example 1 | 0.8 | 0.1 | <0.1 | 1.8 |
| Example 2 | 1.3 | 0.2 | <0.1 | 2.3 |
| Example 3 | 0.9 | 0.1 | <0.1 | 1.9 |
| Example 4 | 1.4 | 0.2 | <0.1 | 2.5 |
| Example 5 | 1.4 | 0.2 | <0.1 | 2.7 |
| Comparative Example 1 | — | 1610 | — | 2470 |
| Comparative Example 2 | 5.9 | 0.2 | <0.1 | 17 |
| Comparative Example 3 | 1.2 | 39 | <0.1 | 5.4 |
| Comparative Example 4 | 1.1 | 3.6 | <0.1 | 3.6 |

Note:
R = rare earth element

It is seen from the acid resistance test data in Table 2 that a single layer coating (Comparative Example 2) is difficult to prevent both the coating material and substrate material from being dissolved out. It is also seen from the results of Comparative Examples 3 and 4 that the dissolution amount of the element of the substrate in the rare earth oxide layer having a porosity of 5% or more is much as compared with that in the rare earth oxide layer having a porosity of less than 5% (Examples 1 to 5). The oxide layer functioned under the attack of HCl such that the oxide itself was dissolved, by virtue of which the dissolution of Al substrate was controlled. However, numerous pores of the oxide layer allow the acid to reach the substrate to some extent through the pores before the reaction of the acid consumption is completed, whereby the substrate is damaged. Under the attack of HF, the oxide was not dissolved or consumed while the dissolution of Al substrate in the penetrating HF solution occurred. In contrast, the multilayer coated samples of Examples are effective in minimizing the dissolution of both coating material element and substrate material element in both acids.

Japanese Patent Application No. 2005-307199 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A corrosion resistant member to be exposed to a halogen-containing gas atmosphere or a halogen-containing gas plasma atmosphere, comprising a substrate and a plurality of layers deposited thereon including a layer of rare earth fluoride providing the outermost surface and a layer of rare earth oxide having a porosity of less than 5% underlying the rare earth fluoride layer,
   said rare earth fluoride layer being a thermally sprayed coating and having a thickness of 10 to 1,000 μm, and
   said rare earth oxide layer being a thermally sprayed coating and having a thickness of 20 to 500 μm.

2. The corrosion resistant member of claim 1 wherein for each layer, the rare earth is a single element selected from the group consisting of Y, Sc, La, Ce, Pr, Nd, Sm, Eu, Gd, Tb, Dy, Ho, Er, Tm, Yb, and Lu.

3. The corrosion resistant member of claim 1 wherein for each layer, the rare earth is a mixture of at least two elements selected from the group consisting of Y, Sc, La, Ce, Pr, Nd, Sm, Eu, Gd, Tb, Dy, Ho, Er, Tm, Yb, and Lu.

4. The corrosion resistant member of claim 1 which consists essentially of the substrate, the rare earth oxide layer thereon, and the rare earth fluoride layer on the oxide layer.

5. The corrosion resistant member of claim 1 which is used in a semiconductor or flat panel display manufacturing apparatus.

6. The corrosion resistant member of claim 1 wherein the substrate is selected from among metals, metal alloys, and ceramics.

7. The corrosion resistant member of claim 6 wherein the substrate is selected from among Al, Mo, Ta, W, Hf, V, Zr, Nb, Ti, stainless steel, quartz, silicon nitride, alumina, and zirconia.

8. The corrosion resistant member of claim 1 wherein a metal or ceramic layer is formed on the substrate at a thickness of 10 to 500 μm.

9. The corrosion resistant member of claim 1 wherein a metal or ceramic layer is formed between the rare earth oxide layer and the rare earth fluoride layer at a thickness of 10 to 500 μm.

10. The corrosion resistant member of claim 1 wherein the plurality of layers have a multilayer structure including more than one set of rare earth oxide layer/rare earth fluoride layer, by forming a first rare earth oxide layer on the substrate, forming a first rare earth fluoride layer on the first oxide layer, forming a second rare earth oxide layer on the first fluoride layer, subsequently forming a second rare earth fluoride layer so that the outer most layer is a rare earth fluoride layer.

* * * * *